United States Patent [19]

Benenati

[11] Patent Number: 4,546,407

[45] Date of Patent: Oct. 8, 1985

[54] HEAT EXCHANGING ELECTRONIC MODULE HOUSING

[76] Inventor: Salvatore Benenati, 77 Woodside Dr., Red Bank, N.J. 07701

[21] Appl. No.: 547,116

[22] Filed: Oct. 31, 1983

[51] Int. Cl.⁴ .............................................. H05K 7/20
[52] U.S. Cl. ..................................... 361/386; 361/395; 361/415
[58] Field of Search ........... 363/141; 165/80 B, 80 D, 165/104.33; 361/379, 381–383, 386–388, 390, 391, 393–395, 399, 412, 413, 415; 174/16 HS

[56] References Cited

U.S. PATENT DOCUMENTS

| | | | |
|---|---|---|---|
| 3,212,568 | 10/1965 | Frawley | 361/386 |
| 3,364,395 | 1/1968 | Donofrio | 361/394 |
| 3,550,681 | 12/1970 | Stier | 165/80 B |
| 3,714,513 | 1/1973 | Marconi | 361/415 |

FOREIGN PATENT DOCUMENTS 2833043 2/1979 Fed. Rep. of Germany ...... 361/386

Primary Examiner—G. P. Tolin

[57] ABSTRACT

A chassis housing modular electronic apparatus functions as heat radiator and dissipator due to the corrugated configuration of the upper side. The modules thereof have heat transfer brackets coupling the heat sources with the radiating member of the chassis.

Resilient card guides are internally mounted to the chassis for the purpose of guiding the modules to their respective connectors; when the modules are in place the card guides apply pressure to the modules causing a closer contact between the brackets and the chassis, improving the heat conductance. The slidably mounted modules can be easily inserted or withdrawn from the chassis without affecting the heat dissipation properties.

7 Claims, 3 Drawing Figures

U.S. Patent     Oct. 8, 1985     4,546,407
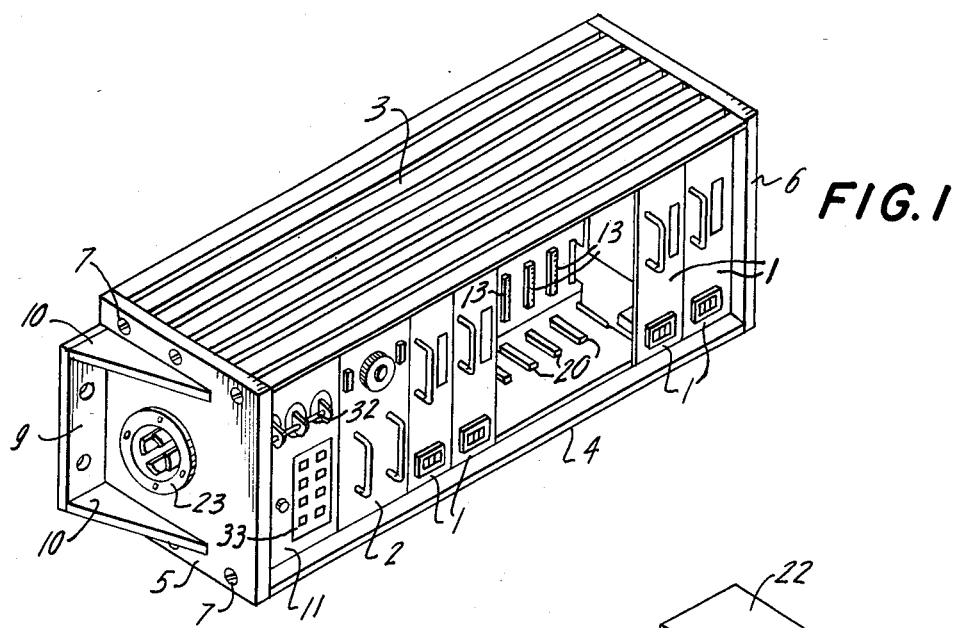

HEAT EXCHANGING ELECTRONIC MODULE HOUSING

BACKGROUND OF INVENTION

1. Field of Invention

The present invention relates to electronic gear, and more specifically, to solid state modular control units having a heat dissipating chassis or housing.

2. Prior Art

It is a known fact that electronic circuits operating at a relatively high power level generate substantial amounts of heat. The heat is normally removed by forcing air to circulate through the interior of the chassis or housing of the apparatus. This technique is satisfactory in most cases. However in applications where the air in the operating environment contains dust, soot and other pollutants, the heat exchange surfaces inside the chassis tend to accumulate a layer of foreign substances which eventually become an effective insulator hampering the cooling of these surfaces by the air. When this condition occurs, electronic components in the circuit overheat and eventually fail.

The technique of mounting "heat sinks" on the heat producing components and exposing the heat sink surfaces to the air outside the chassis has also been employed successfully. However this has not been practical where the heat producing components are located on a module which gets power from a main chassis and is designed to be easily unplugged and replaced.

OBJECTIVE OF THE INVENTION

It is an objective of this invention to provide effective cooling for the electronic components of a plug-in module without circulating air through the main chassis of the modular device.

It is a further objective of this invention to provide the cooling of the components of the module without affecting the ease of plugging and unplugging of the modules into the main chassis.

One more objective of the invention is to provide an electronic module which is simple to assemble, is completely solid state and whose heat generating components are cooled by means of stationary heat exchange.

One more objective of the invention is to provide a housing for modular electronic apparatus which is easily and economically manufactured, is able to dissipate heat, has structural integrity and is able to withstand a rough operating environment.

SUMMARY OF INVENTION

The foregoing objectives are realized in the illustrative embodiment of the invention described in detail below and shown in the accompanying drawings. The illustrative embodiment includes:

A main chassis which houses a plurality of electronic modules, which has upper and lower members in the form of extruded aluminum members or walls having a plurality of cooling fins on their outer sides and retaining formations along their internal surfaces.

An electronic module which is powered through plug-in connectors in the main chassis, having a heat transfer bracket, is capable of being plugged into the retaining receptacle of the main chassis top member. The heat transfer brackets are an integral part of the electronic modules and are mounted to the heat generating power components of the circuit of the module.

A resilient plastic guide, mounted to the lower member of the housing in such a way as to form a spring, presses against the circuit cards in an upward direction, biasing the heat transfer bracket in close contact with the internal surface of the heat-dissipating upper member of the chassis. When the electronic modules are in place and operating, the heat generated by the power components of the circuit is transferred through the heat transfer bracket to the upper member of the chassis and is dissipated to the air.

The construction promotes removal of excess heat from the components of the electronic modules without the use of an internal fan in the chassis; at the same time it is possible to easily assemble and disassemble the modules to and from the main chassis.

BRIEF DESCRIPTION OF THE DRAWINGS

FIG. 1 is a perspective of electrical apparatus embodying features of the invention, showing a main chassis containing a number of modules plugged in.

FIG. 2 is a perspective of an electronic module showing the location of the various components, the heat sink bracket being cut-out to uncover the heat generating component.

FIG. 3 is a cross section of the main chassis with a module in place, showing the relationship between the modules and the chassis.

DESCRIPTION OF THE PREFERRED EMBODIMENT

In an exemplary embodiment of the present invention shown in the accompanying drawings, a main chassis shown in FIG. 1 houses a number of modules 1 and 2. Modules can be of various types and function, illustrated by the temperature control modules 1 and the power supply module 2.

The main chassis is comprised by an upper member 3, a lower member 4, upright left and right side members 5 and 6 to which the top and bottom members are fastened by means of screws 7. Members 3 and 4 are extrusions that are alike (see FIG. 3) and are therefore easily and economically manufactured. The rear cover 8 is assembled by sliding into opposite grooves 26 in the top and bottom members shown in FIG. 3. On the outside surfaces of side members 5 and 6 there are mounting straps 9 with gussets 10 fastened to them and to the side members to strengthen the structure of the straps and the sides themselves. The mounting straps 9 are used to mount the main chassis to an instrument rack (not shown.)

The top and bottom members or wall 3 and 4 have fins 24 that are freely exposed for the purpose of dissipating any heat that may have been transferred to them. The fins are part of the extruded profile of upper wall 3 (FIG. 3) and extend side-to-side between side members 5 and 6 (FIG. 1). When there is no modules plugged into the main frame the front side is open with the exception of panel 11 which is permanently mounted to the main chassis for the purpose of holding a main switch-circuit breaker 32 and an indicating circuit panel 33 which shows if there is continuity in the power section of the various circuits. A printed main circuit board 12 shown in FIG. 3 and a series of connectors 13 are used to receive signals by the various module circuits and distribute power.

FIG. 2 shows an exemplary module which in the preferred embodiment is a temperature controller. The lower part of the module's printed circuit card 36 and the upper part has a heat producing power component which in this case is a solid state relay 15.

When the logic circuitry 14 turns the solid state relay 15 "ON" any heat generated by the solid state relay is absorbed by the relay's own heat sink 16. Bracket 17, as shown, has a horizontal top panel and a vertical side panel that depends from an edge of the top panel and extends fore-and-aft in the chassis. The side is mounted in contact with vertical heat sink 16 of the relay by means of fasteners 27. Bracket 17 is constructed so that the upper surface of its top panel slides against the internal surface of top wall 3 of the main chassis 3 when the module is being inserted and removed, and to remain in contact with it during operation. Any heat generated by the power component 15 is therefore conveyed by the heat transfer bracket 17 to the upper chassis member 3 and from there it is dissipated to the surrounding air. Although the exemplary circuit's function is temperature control, any circuit board having power components can be effectively cooled by this method.

Handle 18 is used to facilitate the insertion and removal of the control modules FIG. 2. Front panel 25 holds the various control components such as switch 19, potentiometer 27, switch 28, digital potentiometer 29, and indicator panel 30.

Resilient guides 20 shown in FIG. 3 and FIG. 1 guide the printed circuit boards of the modules fore-and-aft when they are inserted to line up with connectors 13. The mounting holes 34 on the lower member 4 retain the guide 20 and are slightly closer between them than the distance between pins 35 on the guide; when the guide is assembled it bows upwards forming a spring which tends to press the entire module in an upward direction. Consequently the top panel of the heat transfer bracket is pressed against the upper member 3 of the main chassis improving the contact between the upper surface of the heat sink bracket and the internal surface of upper member 3. This promotes efficient heat transfer between module and chassis.

Retaining formation 21 which is part of the upper member 3 has a recess that opens forward to receive and retain the tip 22 of each bracket 17, to ensure proper contact between the surface of the heat transfer bracket 17 and the surface of the upper member 3. As seen in FIG. 3, the extruded profile of upper wall 3 provides the parallel external fins 24 as well as the lower surface of wall 3 that has sliding heat transfer contact with the heat transfer brackets of the modules 1, and depending retainer 21 that extends side-to-side for cooperation with tips or elements 22 of modules 1. Both walls 3 and 4 have the same fore-and-aft cross-section, including pairs of parallel grooves for main circuit board 12 and rear cover 8. The main chassis has a receptacle 23 for a plug which provides line voltage and a connector (not shown) mounted on the rear panel 8 which connects to the various heaters and the thermocouples providing the feedback signals (not shown).

The modules can be pulled out or inserted and plugged into the main chassis with ease. The contact between surfaces of bracket 17 and upper wall 3 provides good conductance for the heat to be transferred from the internal source to the external heat dissipating surface.

While a particular form of this invention has been illustrated and described, it will be apparent that various modifications can be made without departing from the spirit and scope of the invention.

I claim:

1. Electrical apparatus including an assembly of a main chassis and plural plug-in electronic modules that characteristically develop heat when in operation, said main chassis having upper and lower horizontal walls and upright side members fixing said upper and lower walls in spaced-apart relation, said electronic modules being received between said upper and lower horizontal walls, said chassis having a front opening between said upper and lower walls through which said modules are movable for insertion and removal, the top of said upper wall having parallel heat-dissipating fins extending side-to-side along the chassis and freely exposed to the air above the chassis, said electronic modules having heat-transfer structures at the tops thereof, the top of each of said heat transfer structures and the bottom or inside surface of said upper wall being in sliding and effective heat-transfer contact with each other, guiding and biasing means acting between said lower wall of the chassis and the bottoms of said modules guiding said modules along fore-and-aft paths of insertion and biasing said modules upward, thereby pressing the tops of said heat-transfer structures in effective heat-transfer contact with the bottom or inside surface of said upper wall, said electronic modules including respective upper rearward-extending elements, and a formation depending from the bottom or inner surface of said upper wall and extending side-to-side along the upper wall and hence parallel to said heat dissipating fins, said depending formation opening forward and being shaped complementary to said elements of said modules and being in retentive cooperation therewith, said upper wall having the form of an extrusion whose fore-and-aft vertical cross-sectional profile is intersected by said fins, said bottom or inner surface of the upper wall and said depending formation of said upper wall.

2. Electrical apparatus as in claim 1 wherein the top of each of said heat transfer structures includes a horizontal panel in sliding and effective heat-transfer contact with said upper wall and a vertical panel which depends from an edge of said horizontal panel and which extends fore-and-aft in said chassis, each of said electronic modules having a heat-developing portion in heat-transfer contact with its respective vertical panel.

3. Electrical apparatus as in claim 1 wherein said guiding and biasing means includes elongated members of resilient plastic for said modules, respectively, each said elongated member having formations at its opposite extremities fixed to said lower wall and being bowed upward between its extremities and being and upward-opening channel that receives a respective one of said modules and biases such module upward and guides such module along a fore-and-aft insertion and removal path and restrains such module against sidewise movement.

4. Electrical apparatus as in claim 1 wherein said lower wall has the form of an extrusion having the same fore-and-aft vertical cross-sectional profile as that of said upper wall for economical manufacture, whereby said lower wall has parallel fins extending side-to-side at one surface thereof and a side-to-side formation at the opposite surface thereof corresponding to said depending formation of the upper wall, each of said walls having a pair of side-to-side grooves therein spaced rearward of said depending formations thereof, said upper and lower walls being assembled in the chassis with said pairs of grooves opposite each other, and said chassis having a main circuit board that bears a series of electrical connectors electrically connected to the modules and a rear cover behind the main board, opposite edges of said main circuit board and said cover being received in respective grooves in said upper and lower walls of the chassis.

5. Electrical apparatus comprising a main chassis having upper and lower horizontal walls and upright side members fixing said upper and lower walls in spaced-apart relation for receiving electronic modules that characteristically develop heat when in operation, said chassis having a front opening between said upper and lower walls through which circuit modules are movable for insertion and removal, the top of said upper wall having parallel heat-dissipating fins extending side-to-side along the chassis and freely exposed externally and said upper wall having a bottom or inner surface providing an extended area for sliding and effective heat-transfer contact with heat-transfer structures of such modules, and means assembled to the bottom wall of the chassis for guiding such modules into the chassis to prescribed positions and for restraining said modules against sidewise movement, said means including elongated resilient members extending fore-and-aft in the chassis and fixed to the lower plate for pressing modules upward, when inserted, to bear against said bottom surface of the upper wall and having module-guiding and lateral restraining formations, said upper wall including a formation depending from its bottom surface near the rear thereof and extending side-to-side along the chassis, the formation having a forward-opening recess for receiving and retaining complementary formations of modules when inserted into the chassis, said upper wall having the form of an extrusion whose fore-and-aft vertical cross-sectional profile intersects said fins and said bottom or inner surface of the top wall and said depending formation.

6. Electrical apparatus as in claim 5 wherein said upper and lower walls have respective pairs of side-to-side grooves therein opposite each other near the rear edges thereof, a main circuit board having electrical receptacles for electrical connection to respective circuit modules when inserted, and a rear cover behind said main circuit board, opposite edges of said main circuit board and said rear cover being received, respectively, in said grooves in the upper and lower walls.

7. Electrical apparatus as in claim 6, wherein said lower wall has the form of an extrusion, the fore-and-aft vertical cross-sectional profile of the lower wall being the same as that of said upper wall.

* * * * *